US009338855B2

(12) United States Patent
Hirasawa et al.

(10) Patent No.: US 9,338,855 B2
(45) Date of Patent: May 10, 2016

(54) LIGHTING APPARATUS AND LIGHT EMISSION CONTROL METHOD

(75) Inventors: Akira Hirasawa, Kawasaki (JP); Yuhki Terao, Kawasaki (JP)

(73) Assignee: PIONEER CORPORATION, Kawasaki, Kanagawa (JP)

( * ) Notice: Subject to any disclaimer, the term of this patent is extended or adjusted under 35 U.S.C. 154(b) by 8 days.

(21) Appl. No.: 14/241,847

(22) PCT Filed: Aug. 31, 2011

(86) PCT No.: PCT/JP2011/069754
§ 371 (c)(1),
(2), (4) Date: Apr. 25, 2014

(87) PCT Pub. No.: WO2013/030975
PCT Pub. Date: Mar. 7, 2013

(65) Prior Publication Data
US 2014/0292223 A1    Oct. 2, 2014

(51) Int. Cl.
*H01L 27/32* (2006.01)
*H05B 33/08* (2006.01)

(52) U.S. Cl.
CPC ........ *H05B 33/0896* (2013.01); *H01L 27/3211* (2013.01); *H05B 33/0857* (2013.01); *H01L 2251/5361* (2013.01)

(58) Field of Classification Search
CPC ................................. H05B 33/12; H05B 7/02
See application file for complete search history.

(56) References Cited

U.S. PATENT DOCUMENTS

| 9,135,851 B2* | 9/2015 | Rykowski ............. G09G 3/006 |
| 2005/0116619 A1* | 6/2005 | Kuma .................. H01L 27/322 313/503 |
| 2005/0269487 A1* | 12/2005 | Ozawa ..................... G01J 1/02 250/214 R |
| 2007/0076438 A1* | 4/2007 | Chien .................... F21S 8/035 362/641 |
| 2008/0061683 A1* | 3/2008 | Bertram ............. H01L 51/5271 313/504 |

(Continued)

FOREIGN PATENT DOCUMENTS

| JP | 2003-195817 A1 | 7/2003 |
| JP | 2005-317296 A1 | 11/2005 |
| JP | 2009-099378 A1 | 5/2009 |

OTHER PUBLICATIONS

International Search Report and Written Opinion dated Nov. 22, 2011, issued for International Application No. PCT/JP2011/069754.

*Primary Examiner* — Jason M Crawford
*Assistant Examiner* — Kurtis R Bahr
(74) *Attorney, Agent, or Firm* — Procopio, Cory, Hargreaves & Savitch LLP

(57) ABSTRACT

A lighting apparatus includes: a plurality of light emission units that respectively emit lights in luminescent colors different from each other; and a control unit that controls in luminance the respective light, which are emitted from said plurality of light emission units, for the respective luminescent colors. In response to a control input, said control unit switches between a first light emission mode that it makes said light emission units emit light with luminance set for the respective luminescent colors and a second light emission mode that makes it light emission units corresponding to at least one luminescent color turn off or emit light with luminance lower than the luminance in the first light emission mode.

9 Claims, 5 Drawing Sheets

| LIGHT EMISSION PATTERN | FIRST LIGHT EMISSION UNIT | SECOND LIGHT EMISSION UNIT | THIRD LIGHT EMISSION UNIT | FOURTH LIGHT EMISSION UNIT |
|---|---|---|---|---|
| 1 | TURNING-OFF | TURNING-OFF | TURNING-OFF | $0 < A_4 \leq 1$ |
| 2 | TURNING-OFF | TURNING-OFF | $0 < A_3 = A_4 \leq 1$ | |
| 3 | TURNING-OFF | TURNING-OFF | $0 < A_3 < A_4 \leq 1$ | |
| 4 | TURNING-OFF | $0 < A_2 = A_3 = A_4 \leq 1$ | | |
| 5 | TURNING-OFF | $0 < A_2 = A_3 < A_4 \leq 1$ | | |
| 6 | TURNING-OFF | $0 < A_2 < A_3 = A_4 \leq 1$ | | |
| 7 | TURNING-OFF | $0 < A_2 < A_3 < A_4 \leq 1$ | | |
| 8 | | $0 < A_1 = A_2 = A_3 < A_4 \leq 1$ | | |
| 9 | | $0 < A_1 = A_2 < A_3 = A_4 \leq 1$ | | |
| 10 | | $0 < A_1 < A_2 = A_3 = A_4 \leq 1$ | | |
| 11 | | $0 < A_1 = A_2 < A_3 < A_4 \leq 1$ | | |
| 12 | | $0 < A_1 < A_2 = A_3 < A_4 \leq 1$ | | |
| 13 | | $0 < A_1 < A_2 < A_3 = A_4 \leq 1$ | | |
| 14 | | $0 < A_1 < A_2 < A_3 < A_4 \leq 1$ | | |

(56) References Cited

U.S. PATENT DOCUMENTS

| | | | | |
|---|---|---|---|---|
| 2011/0260190 A1* | 10/2011 | Aoyama | ............... | H01L 25/048 257/98 |
| 2012/0025732 A1* | 2/2012 | Hamaguchi | ........ | H05B 33/0896 315/250 |
| 2012/0104367 A1* | 5/2012 | Hasegawa | ........... | H01L 51/5275 257/40 |
| 2012/0319593 A1* | 12/2012 | Jou | .................... | H05B 33/0869 315/152 |

* cited by examiner (a)

| LIGHT EMISSION PATTERN | FIRST LIGHT EMISSION UNIT | SECOND LIGHT EMISSION UNIT |
|---|---|---|
| 1 | TURNING-OFF | $0 < A_2 \leq 1$ |
| 2 | \multicolumn{2}{c}{$0 < A_1 < A_2 \leq 1$} |

FIG.4

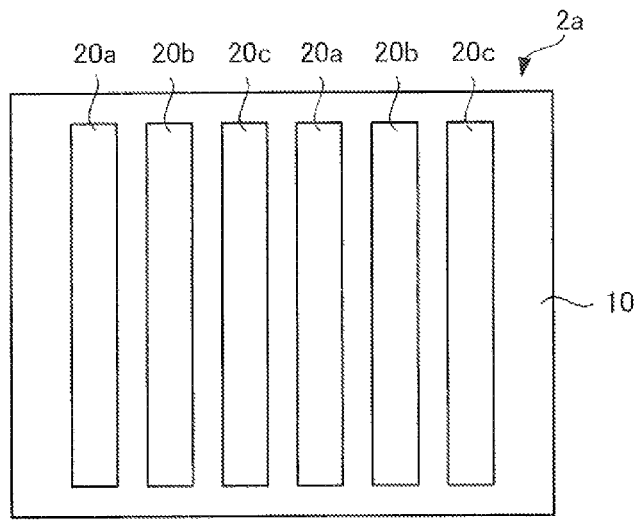

FIG.5

| LIGHT EMISSION PATTERN | FIRST LIGHT EMISSION UNIT | SECOND LIGHT EMISSION UNIT | THIRD LIGHT EMISSION UNIT |
|---|---|---|---|
| 1 | TURNING-OFF | TURNING-OFF | $0 < A_3 \leq 1$ |
| 2 | TURNING-OFF | $0 < A_2 = A_3 \leq 1$ | |
| 3 | TURNING-OFF | $0 < A_2 < A_3 \leq 1$ | |
| 4 | $0 < A_1 = A_2 < A_3 \leq 1$ | | |
| 5 | $0 < A_1 < A_2 = A_3 \leq 1$ | | |
| 6 | $0 < A_1 < A_2 < A_3 \leq 1$ | | |

FIG.6

| | MATERIAL OF LIGHT EMITTING LAYER | LUMINESCENT COLOR | 5000K/HOUR | |
|---|---|---|---|---|
| | | | LUMINANCE RATIO BETWEEN LUMINESCENT COLORS | RATIO IN LIGHT EMISSION LIFE |
| FIRST LIGHT EMISSION UNIT | Ir(ppy)$_3$ | GREEN | 44 | 14 |
| SECOND LIGHT EMISSION UNIT | Ir(phq)$_2$tpy | RED | 39 | 29 |
| THIRD LIGHT EMISSION UNIT | DPAVBi | BLUE | 17 | 57 |

FIG.7

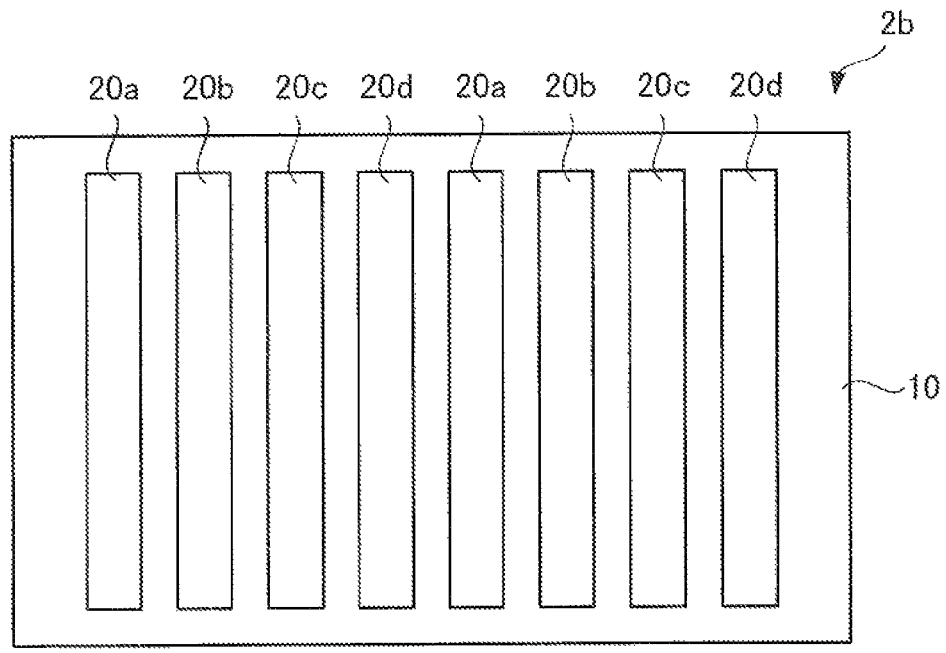

FIG.8

| LIGHT EMISSION PATTERN | FIRST LIGHT EMISSION UNIT | SECOND LIGHT EMISSION UNIT | THIRD LIGHT EMISSION UNIT | FOURTH LIGHT EMISSION UNIT |
|---|---|---|---|---|
| 1 | TURNING-OFF | TURNING-OFF | TURNING-OFF | $0 < A_4 \leq 1$ |
| 2 | TURNING-OFF | TURNING-OFF | $0 < A_3 = A_4 \leq 1$ | |
| 3 | TURNING-OFF | TURNING-OFF | $0 < A_3 < A_4 \leq 1$ | |
| 4 | TURNING-OFF | $0 < A_2 = A_3 = A_4 \leq 1$ | | |
| 5 | TURNING-OFF | $0 < A_2 = A_3 < A_4 \leq 1$ | | |
| 6 | TURNING-OFF | $0 < A_2 < A_3 = A_4 \leq 1$ | | |
| 7 | TURNING-OFF | $0 < A_2 < A_3 < A_4 \leq 1$ | | |
| 8 | $0 < A_1 = A_2 = A_3 < A_4 \leq 1$ | | | |
| 9 | $0 < A_1 = A_2 < A_3 = A_4 \leq 1$ | | | |
| 10 | $0 < A_1 < A_2 = A_3 = A_4 \leq 1$ | | | |
| 11 | $0 < A_1 = A_2 < A_3 < A_4 \leq 1$ | | | |
| 12 | $0 < A_1 < A_2 = A_3 < A_4 \leq 1$ | | | |
| 13 | $0 < A_1 < A_2 < A_3 = A_4 \leq 1$ | | | |
| 14 | $0 < A_1 < A_2 < A_3 < A_4 \leq 1$ | | | |

LIGHTING APPARATUS AND LIGHT EMISSION CONTROL METHOD

TECHNICAL FIELD

The present invention relates to lighting apparatuses, and more particularly relates to a lighting apparatus having a plurality of light emission units that emit light in colors different from each other and a light emission control method for the plurality of light emission units.

BACKGROUND ART

To improve energy efficiency in lighting apparatuses, research and development are being pursued to obtain light sources that take the place of incandescent lamps and fluorescent lights. Recently, high luminance light emitting diodes (LEDs) and the like are regarded as one of the most promising candidates, and their application products are actually being manufactured on a commercial basis. Reflecting this trend, commercialization of lightings with use of organic electroluminescence elements (hereinafter referred to as organic EL elements) are coming close to fruition.

The LED lightings need to diffuse light by some method since the light emitting elements emit light as point light. As compared with this, a panel itself emits light in the organic EL lightings, so that wide and uniform light can advantageously be obtained. Moreover, since the panel is extremely thin, the panel can be pasted on walls, ceilings and the like, so that the wall surfaces of rooms themselves can be used as a lighting. The panel can also be pasted on curved surfaces by using a plastic substrate.

The organic EL elements gradually deteriorate and their luminance is degraded under the influence by operation, oxygen and/or humidity. In recent years, in order to extend the lives of the organic EL elements, development of luminescent materials with sufficient chemical stability, and innovation of techniques in sealing, bonding and the like with respect to element structures have been advanced. As a result, life characteristics of the organic EL elements have considerably been improved. The extension of life is also pursued by suppressing a driving current of the organic EL elements.

For example, Patent Literature 1 discloses a display device in which, among a plurality of light emitting layers different in luminescent color from each other, a light emitting layer low in luminous efficiency is provided in plural inside a unit display range, so as to increase the area of the light emitting layers in the unit display region for the purpose of suppressing the driving current while gaining white balance.

CITATION LIST

Patent Literature

Patent Literature 1
Japanese Patent Application Laid-Open No. 2009-99378

SUMMARY OF INVENTION

Technical Problem

In lighting apparatuses with use of the organic EL elements, one method for obtaining white light involves laminating or juxtaposing light emitting elements that emit light in red, green and blue colors and mixing these luminescent colors. However, the organic EL elements have a problem that their lives are different in each color. For example, green phosphorescent devices and red phosphorescent devices are said to have a luminance half-life of about 200,000 hours or more with initial luminance being 1000 cd/cm$^2$, whereas blue phosphorescent devices are said to have a luminance half-life of about 10,000 hours with initial luminance being 500 cd/cm$^2$. Thus, when the lives of devices is different in each luminescent color, the hue of the white light obtained by color mixture undesirably changes with the lapse of driving time.

The present invention has been made in view of this point, and an object of the present invention is to provide a lighting apparatus having a plurality of light emission units that are different in luminescent color from each other and being capable of reducing a difference in life between the light emission units (between the luminescent colors), and a light emission control method for the plurality of light emission units.

Solution to Problem

A lighting apparatus of the present invention includes: a plurality of light emission units that respectively emit lights in luminescent colors different from each other; and a control unit that controls in luminance the respective lights, which are emitted from said light emission units, for the respective luminescent colors, wherein in response to a control input, said control unit switches between a first light emission mode that it makes said light emission units emit light with luminance set for the respective luminescent colors and a second light emission mode that it makes light emission units corresponding to at least one luminescent color turn off or emit light with luminance lower than the luminance in the first light emission mode.

A light emission control method of the present invention is a light emission control method for a plurality of light emission units that respectively emit lights in luminescent colors different from each other in a lighting apparatus including said plurality of light emission units, the method including switching between a first light emission mode in which are made said light emission units emit light with luminance set for the respective luminescent colors and a second light emission mode in which are made light emission units corresponding to at least one luminescent color turn off or emit light with luminance lower than the luminance in the first light emission mode.

BRIEF DESCRIPTION OF DRAWINGS

FIG. 3 is a table showing light emission patterns of the light emitting panel in a night-light mode according to the first embodiment of the present invention.

FIG. 4 is a plan view illustrating the configuration of a light emitting panel according to a second embodiment of the present invention.

FIG. 5 is a table showing light emission patterns of the light emitting panel in the night-light mode according to the second embodiment of the present invention.

FIG. 6 illustrates one example of a luminance ratio and a life ratio between each light emission unit in a normal mode.

FIG. 7 is a plan view illustrating the configuration of a light emitting panel according to a third embodiment of the present invention.

FIG. 8 is a table showing light emission patterns of the light emitting panel in the night-light mode according to the third embodiment of the present invention.

DESCRIPTION OF EMBODIMENTS

Hereinbelow, embodiments of the present invention will be described with reference to the drawings. Throughout the drawings, substantially identical or equivalent component members are designated by identical reference symbols.

First Embodiment

Figure 1:
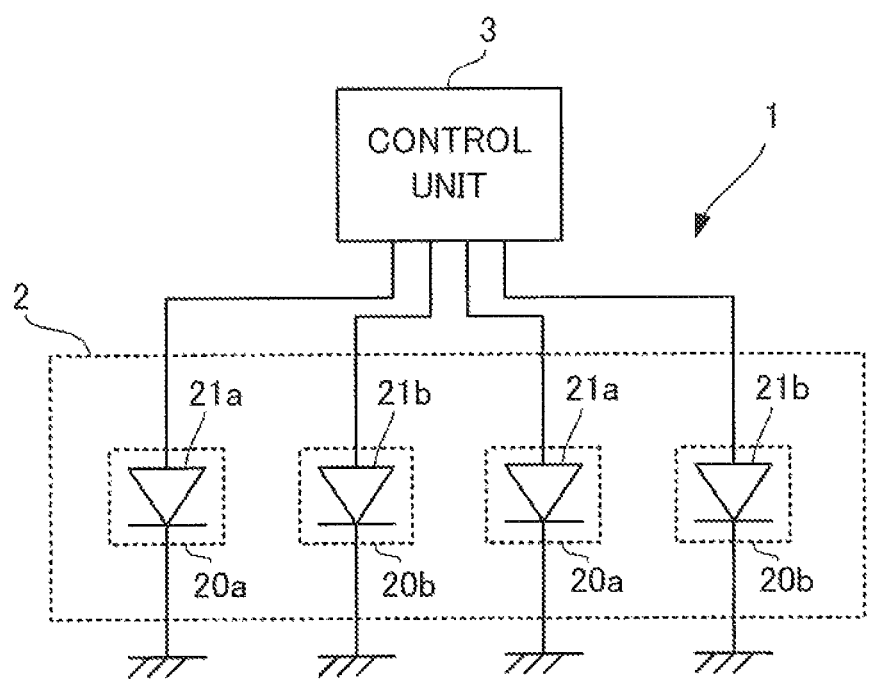
FIG. 1 is a circuit block diagram illustrating the configuration of a lighting apparatus according to a first embodiment of the present invention.
Figure 2:
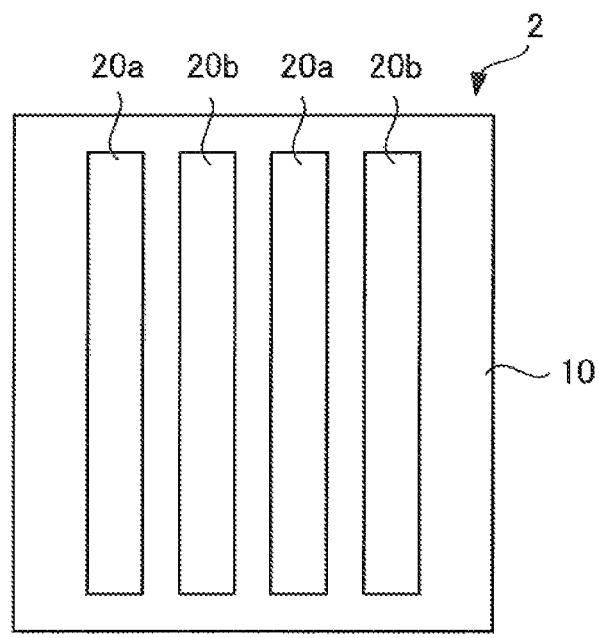
FIGS. 2(a) and 2(b) are respectively a plan view and a cross sectional view illustrating the configuration of a light emitting panel according to the first embodiment of the present invention.
Figure 2:
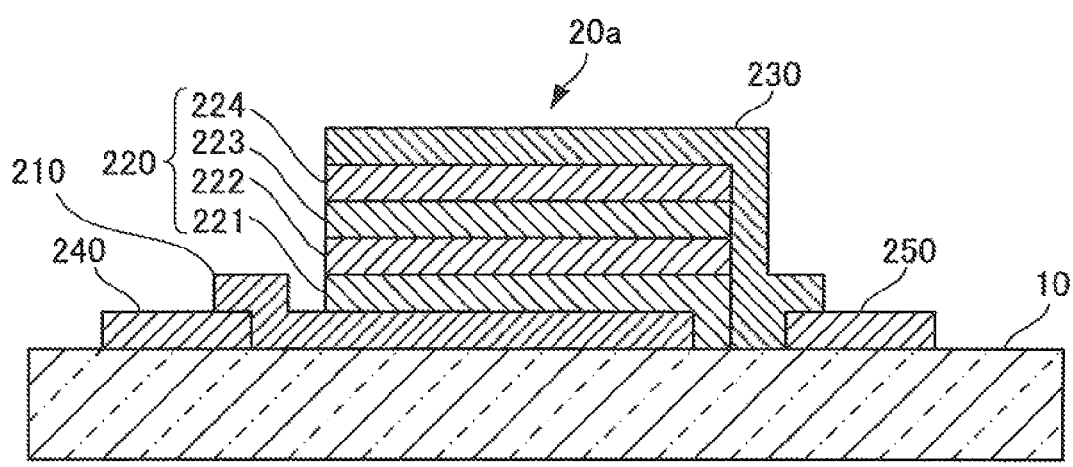

FIG. 1 is a circuit block diagram illustrating the configuration of a lighting apparatus 1 according to a first embodiment of the present invention. FIGS. 2(a) and 2(b) are respectively a plan view and a cross sectional view illustrating the configuration of a light emitting panel 2 that forms the lighting apparatus 1.

As illustrated in FIG. 1, the lighting apparatus 1 includes a light emitting panel 2 and a control unit 3. The light emitting panel 2 includes organic EL elements 21a and 21b configured to form a first light emission unit 20a and a second light emission unit 20b, respectively.

The organic EL elements 21a and 21b have light emitting layers doped with dye materials different from each other. These light emitting layers generate light in colors different from each other. More specifically, the lighting apparatus 1 has the first light emission unit 20a (organic EL element 21a) having a first luminescent color, and a second light emission unit 20b (organic EL element 21b) having a second luminescent color. Although FIGS. 1 and 2(a) illustrate the light emitting panel 2 configured to have two light emission units for each color, the number of the light emission units can suitably be changed for each luminescent color.

For example, cathodes of the organic EL elements 21a and 21b are fixed to earth potentials, while anodes are connected to the control unit 3. The organic EL elements 21a and 21b emit light with the luminance corresponding to the amount of the driving current fed from the control unit 3.

The control unit 3 includes a drive circuit that drives the organic EL elements 21a and 21b, a light emission control program describing light emission patterns in a later-described normal light emission mode (first light emission mode) and night-light mode (second light emission mode), and a central processing unit (CPU) that runs the light emission control program. The control unit 3 feeds an independently-controlled driving current to the first light emission unit 20a (organic EL element 21a) and the second light emission unit 20b (organic EL element 21a). In other words, the control unit 3 controls the luminance of the light emitted from each of the light emission units 20a and 20b for each luminescent color. The first luminescent color emitted from the light emission unit 20a and the second luminescent color emitted from the light emission unit 20b are mixed, so that illumination light recognized as a single luminescent color is emitted from a light emission surface of the light emitting panel 2. Based on a control input from the outside (for example, operation by a user, control signals from external devices, etc.), the control unit 3 changes the driving current fed to each of the organic EL elements 21a and 21b and a current ratio thereof, so that the brightness and the color of the illumination light emitted from the light emission surface of the light emitting panel 2 can arbitrarily be changed. The control unit 3 also drives the light emitting panel 2 in any one of the normal light emission mode (first light emission mode) and the night-light mode (second light emission mode) in response to a control input from the outside (for example, operation by a user, control signals from external devices, etc.). The details of these two light emission modes will be described later.

For example, the light emitting panel 2 is configured to have the light emission units 20a and 20b alternately arranged side by side on the substrate 10 as illustrated in FIG. 2(a). A shape, size, number, and arrangement of each of the light emission units 20a and 20b may arbitrarily be set. However, in the case of mixing two colors to obtain illumination light of a single luminescent color as in the present embodiment, it is preferable to evenly arrange the light emission units 20a and 20b without deviation.

As illustrated in FIG. 2(b), the light emitting panel 2 includes a light emission unit comprising an organic EL element formed by laminating an anode 210, an organic semiconductor layer 220, and a cathode 230 in this order on the substrate 10. Although FIG. 2(b) illustrates only one organic EL element 21a which forms the first light emission unit 20a, the second light emission unit 20b having the same configuration as the first light emission unit 20a is provided on the substrate in actuality.

For example, the substrate 10 is a light transmissive substrate made of glass, acrylic resin, or the like. The substrate 10 may be a flexible substrate made of polycarbonate, polyethylene terephthalate (PET), or the like.

For example, the anode 210 is formed by depositing a metal oxide conductive material having light transparency, such as indium tin oxide (ITO), on the substrate 10 by sputtering process and the like and by patterning the deposited conductive material by etching process. The anode 210 is connected to wiring pattern 240 formed on the substrate 10. The organic functional layer 220 has a laminated structure which is made up of, for example, a hole injection layer 221, a hole transport layer 222, a light emitting layer 223, and an electron injection layer 224. For example, the hole injection layer 221 is made of copper phthalocyanine (CuPc) with a thickness of about 20 nm. The hole transport layer 222 is made of α-NPD (Bis[N-(1-naphthyl)-N-phenyl]benzidine) with a thickness of about 50 nm. The material of the light emitting layer 223 is selected in accordance with luminescent colors. In the case of red color, $Ir(phq)_2tpy$ and the like may be used for example. In the case of green color, $Ir(ppy)_3$ and the like may be used for example. In the case of blue color, DPAVBi and the like may be used. The electron injection layer 224 may be formed of lithium fluoride (LiF) with a thickness of about 0.5 nm. For example, the cathode 230 is formed by depositing Al with a thickness of about 100 nm on the organic functional layer 23 by vacuum evaporation and the like. The cathode 230 is connected to wiring pattern 250 formed on the substrate 10.

The control unit 3 drives the light emitting panel 2 in any one of the normal light emission mode (i.e. first light emission mode) and the night-light mode (i.e. second light emission mode) in response to a control input from the outside (for example, operation by a user, control signals from external devices, etc.).

For example, the normal light emission mode is a mode to be selected in the case where relatively bright illumination light is desired to obtain fixed brightness. When the normal light emission mode is selected, the control unit 3 drives the light emitting panel 2 so as to turn on each of the light emission units 20a and 20b with relatively high luminance. In short, the control unit 3 feeds a relatively large driving current to each of the organic EL elements 21a and 21b. In the normal light emission mode, the luminance of the first light emission unit 20a may be identical to or different from the luminance of the second light emission unit 20b. The driving current fed to each of the organic EL elements 21a and 21b may be identical to or different from each other.

Contrary to the normal light emission mode, the night-light mode is a mode to be selected, for example, when illumination light less bright than the normal light emission mode is desired for such purpose as checking location at night time. When the night-light mode is selected, the control unit 3 drives the light emitting panel 2 so as to generate, as the whole light emitting panel, illumination light which is less bright than the light in the normal light emission mode.

FIG. 3 is a table showing variations in the light emission pattern (first and second light emission patterns) in the night-light mode in the light emitting panel 2. In FIG. 3, $A_1$ represents a ratio ($B_{a2}/B_{a1}$ which is hereinafter referred to as a luminance ratio $A_1$) of luminance $B_{a1}$ in the night-light mode to luminance $B_{a1}$ in the normal light emission mode in the first light emission unit 20a. $A_2$ represents a ratio ($B_{b2}/B_{b1}$ which is hereinafter referred to as a luminance ratio $A_2$) of luminance $B_{b2}$ in the night-light mode to luminance $B_{b1}$ in the normal light emission mode in the second light emission unit 20b. In the present embodiment, a life $LT_a$ of the first light emission unit 20a (organic EL element 21a) having a first luminescent color and a life $LT_b$ of the second light emission unit 20b (organic EL element 21b) having a second luminescent color are assumed to have a relationship of $LT_a<LT_b$. The life of the light emission unit refers to accumulated driving time taken until the luminance in each light emission unit becomes, for example, a half of an initial value due to deterioration.

The first light emission pattern in the night-light mode is to turn off each of the shorter-life first light emission units 20a and to turn on each of the longer-life second light emission units 20b with the luminance equal to or lower than the luminance in the normal light emission mode ($0<A_2 \leq 1$).

The second light emission pattern in the night-light mode is to turn on each of the light emission units so that the luminance ratio $A_1$ of the shorter-life first light emission units 20a is smaller than the luminance ratio $A_2$ of the longer-life second light emission units 20b ($0<A_1<A_2 \leq 1$). In driving the light emitting panel 2 in the night-light mode, a light emission pattern may be made selectable from the first light emission pattern and the second light emission pattern. The luminance of the light emission units 20a and 20b is adjusted when the control unit 3 controls the driving current.

Thus, the lighting apparatus 1 according to the first embodiment includes the light emitting panel 2 having two kinds of light emission units 20a and 20b which are different in luminescent color from each other, and the light emitting panel 2 is driven in any one of the normal light emission mode (first light emission mode) and the night-light mode (second light emission mode) in accordance with the driving current from the control unit 3. In the night-light mode, the shorter-life first light emission units 20a are turned off or driven so that the luminance ratio $A_1$ thereof is smaller than the luminance ratio $A_2$ of the longer-life second light emission units 20b. More specifically, in the night-light mode, the first light emission units 20a are driven so that their load is smaller than that of the second light emission units 20b. As a consequence, progression of luminance deterioration in the first light emission units 20a in the night-light mode becomes slower than that of the second light emission units 20b. As a result, a difference in life between the light emission units (between the luminescent colors) can be decreased. Therefore, it becomes possible to reduce temporal change in chromaticity of the illumination light obtained by mixing the respective luminescent colors.

Second Embodiment

FIG. 4 is a plan view illustrating the configuration of a light emitting panel 2a that forms a lighting apparatus according to a second embodiment of the present invention. The light emitting panel 2a has a first light emission unit 20a, a second light emission unit 20b, and a third light emission unit 20c which have luminescent colors different from each other. In other words, the lighting apparatus according to the second embodiment is different from the aforementioned lighting apparatus 1 according to the first embodiment in the point that the third light emission unit 20c is further included in the light emitting panel. Since component members other than the third light emission unit are similar to those of the lighting apparatus 1 according to the first embodiment, a detailed description thereof is omitted.

Each of the light emission units 20a, 20b, and 20c receives a driving current fed from the control unit, while the driving current is controlled (light emission is controlled) for each luminescent color. A first luminescent color emitted from the light emission unit 20a, a second luminescent color emitted from the light emission unit 20b, and a third luminescent color emitted from the light emission unit 20c are mixed, so that illumination light recognized as a single luminescent color is emitted from a light emission surface of the light emitting panel 2a.

For example, the light emitting panel 2a is formed by repeatedly arranging the light emission units 20a, 20b, and 20c side by side in this order on the substrate 10. A shape, size, number, and arrangement of each of the light emission units 20a, 20b, and 20c may arbitrarily be set. However, in the case of mixing three colors to obtain illumination light of a single luminescent color as in the present embodiment, it is preferable to evenly arrange the light emission units 20a, 20b, and 20c without deviation.

As in the case of the first embodiment, the control unit drives the light emitting panel 2a in any one of the normal light emission mode (first light emission mode) and the night-light mode (second light emission mode) in response to a control input from the outside (for example, operation by a user, control signals from external devices, etc.).

When the normal light emission mode (first light emission mode) is selected, the control unit drives the light emitting panel 2a so as to turn on each of the light emission units 20a, 20b, and 20c with relatively high luminance. In short, the control unit feeds a relatively large driving current to each of the light emission units 20a, 20b, and 20c. In the normal light emission mode, each of the light emission units 20a, 20b, and 20c may have luminance identical to or different from each other. The driving current fed to each of the organic EL elements which form the light emission units 20a, 20b, and 20c may be identical to or different from each other.

When the night-light mode (second light emission mode) is selected, the control unit drives the light emitting panel 2a so as to generate, as the whole light emitting panel, illumination light which is less bright than the light in the normal light emission mode.

FIG. 5 is a table showing variations in the light emission pattern (first to sixth light emission patterns) in the light emitting panel 2a in the night-light mode. In FIG. 5, $A_1$ represents a ratio ($B_{a2}/B_{a1}$ which is hereinafter referred to as a luminance ratio $A_1$) of luminance $B_{a2}$ in the night-light mode to luminance $B_{a1}$ in the normal light emission mode in the first light emission unit 20a. $A_2$ represents a ratio ($B_{b2}/B_{b1}$ which is hereinafter referred to as a luminance ratio $A_2$) of luminance $B_{b2}$ in the night-light mode to luminance $B_{b1}$ in the normal light emission mode in the second light emission unit 20b. $A_3$ represents a ratio ($B_{c2}/B_{c1}$ which is hereinafter referred to as a luminance ratio $A_3$) of luminance $B_{c2}$ in the night-light mode to luminance $B_{c1}$ in the normal light emission mode in the third light emission unit 20c.

In the present embodiment, a life $LT_a$ of the first light emission unit 20a having the first luminescent color, a life $LT_b$ of the second light emission unit 20b having the second luminescent color, and a life $LT_c$ of the third light emission unit 20c having the third luminescent color are assumed to have a relationship of $LT_a<LT_b<LT_c$.

FIG. 6 illustrates one example of a luminance ratio and a life ratio between luminescent colors in each of the light emission units in the normal mode. The first light emission unit 20a includes a light emitting layer made of, for example, Ir(ppy)$_3$ to generate green light. The second light emission unit 20b includes a light emitting layer made of, for example, Ir(phq)$_2$tpy to generate red light. The third light emission unit 20c includes a light emitting layer made of, for example, DPAVBi to generate blue light. The control unit executes light emission control so that a luminance ratio between the luminescent colors of the light emission units 20a, 20b, and 20c is set to 44:39:17 in the normal light emission mode to generate illumination light with a color temperature of 5000K. When each of the light emission units is driven at such a luminance ratio between the luminescent colors in the normal light emission mode, the life ratio of the light emission units 20a, 20b, and 20c becomes 14:29:59. The life ratio may also be expressed as $LT_a<LT_b<LT_c$.

The first light emission pattern in the night-light mode is to turn off each of the first light emission units 20a and each of the second light emission units 20b while turning on each of the longest-life third light emission units 20c with the luminance equal to or lower than the luminance in the normal light emission mode ($0<A_3\leq1$).

The second and third light emission patterns in the night-light mode are to turn off each of the shortest-life first light emission units 20a and to turn on each of the second and third light emission units 20b and 20c with the luminance equal to or lower than the luminance in the normal light emission mode. In the second light emission pattern, each of the second and third light emission units is driven so that the luminance ratio $A_2$ of the second light emission units 20b is equal to the luminance ratio $A_3$ of the third light emission units 20c ($0<A_2=A_3\leq1$). In the third light emission pattern, each of the second and third light emission units is driven so that the luminance ratio $A_2$ of the second light emission units 20b is smaller than the luminance ratio $A_3$ in the third light emission units ($0<A_2<A_3\leq1$).

The fourth to sixth light emission patterns in the night-light mode are to turn on each of the first to third light emission units 20a, 20b, and 20c with the luminance equal to or lower than the luminance in the normal light emission mode. In the fourth light emission pattern, each of the light emission units is driven so that the luminance ratio $A_1$ of the first light emission units 20a is equal to the luminance ratio $A_2$ of the second light emission units 20b and the luminance ratio $A_2$ of the second light emission units 20b is smaller than the luminance ratio $A_3$ of the third light emission units 20c ($0<A_1=A_2<A_3\leq1$). In the fifth light emission pattern, each of the light emission units is driven so that the luminance ratio $A_1$ of the first light emission units 20a is smaller than the luminance ratio $A_2$ of the second light emission units 20b and the luminance ratio $A_2$ of the second light emission units 20b is equal to the luminance ratio $A_3$ of the third light emission units 20c ($0<A_1<A_2=A_3\leq1$). In the sixth light emission pattern, each of the light emission units is driven so that the luminance ratio $A_1$ of the first light emission units 20a is smaller than the luminance ratio $A_2$ of the second light emission units 20b and the luminance ratio $A_2$ of the second light emission units 20b is smaller than the luminance ratio $A_3$ of the third light emission units 20c ($0<A_1<A_2<A_3\leq1$). In driving the light emitting panel 2a in the night-light mode, a light emission pattern may be made selectable from the first to sixth light emission patterns. The luminance of each of the light emission units 20a, 20b, and 20c is adjusted by the control unit controlling the driving current.

Thus, the lighting apparatus according to the second embodiment includes the light emitting panel 2a having three kinds of light emission units 20a, 20b, and 20c which are different in luminescent color from each other, and the light emitting panel 2a is driven in any one of the normal light emission mode (first light emission mode) and the night-light mode (second light emission mode) in accordance with the driving current from the control unit. In the night-light mode, the light emitting panel is driven so that the shortest-life first light emission units 20a are turned off or driven so that the luminance ratio $A_1$ thereof is smaller than the luminance ratio $A_3$ in the longest-life third light emission units 20c and is equal to or smaller than the luminance ratio $A_2$ of the second light emission units 20b. Further, the light emitting panel is driven so that the luminance ratio $A_2$ of the second light emission units 20b is equal to or smaller than the luminance $A_3$ of the third light emission units. In short, in the night-light mode, the shorter-life light emission units are driven so as to have a less load than the longer-life light emission units. As a consequence, progression of luminance deterioration in the shorter-life light emission units in the night-light mode becomes slower than that of the longer-life light emission units. As a result, a difference in life between the respective light emission units (between the luminescent colors) can be decreased. Therefore, it becomes possible to reduce temporal change in chromaticity of the illumination light obtained by mixing the respective luminescent colors.

Third Embodiment

FIG. 7 is a plan view illustrating the configuration of a light emitting panel 2b that forms a lighting apparatus according to a third embodiment of the present invention. The light emitting panel 2b has a first light emission unit 20a, a second light emission unit 20b, a third light emission unit 20c, and a fourth light emission unit 20d which have luminescent colors different from each other. In other words, the lighting apparatus according to the third embodiment is different from the aforementioned lighting apparatus 1 according to the first embodiment in the point that the third light emission unit 20c and the fourth light emission unit 20d are further included in the light emitting panel. Since component members other than these units are similar to those of the lighting apparatus 1 according to the first embodiment, a description thereof is omitted.

Each of the light emission units 20a, 20b, 20c, and 20d receives a driving current fed from the control unit, while the driving current is controlled (light emission is control) in each luminescent color. A first luminescent color emitted from the light emission unit 20a, a second luminescent color emitted from the light emission unit 20b, a third luminescent color emitted from the light emission unit 20c, and a fourth luminescent color emitted from the light emission unit 20d are mixed, so that illumination light recognized as a single luminescent color is emitted from a light emission surface of the light emitting panel 2b.

FIG. 7 illustrates the case where the light emitting panel 2b has the light emission units 20a, 20b, 20c, and 20d in pairs, and the light emission units 20a, 20b, 20c, and 20d are arranged side by side in this order on the substrate 10. However, the number and arrangement of each of the light emission units 20a, 20b, 20c, and 20d may suitably be changed. When four colors are mixed to obtain illumination light of a single luminescent color as in the present embodiment, it is preferable to evenly arrange the light emission units 20a, 20b, 20c, and 20d without deviation.

For example, the light emitting panel 2b is formed by repeatedly arranging the light emission units 20a, 20b, 20c, and 20d side by side in this order on the substrate 10. A shape, size, number, and arrangement of each of the light emission units 20a, 20b, 20c, and 20d may arbitrarily be set. However, in the case of mixing four colors to obtain illumination light of a single luminescent color as in the present embodiment, it is preferable to evenly arrange the light emission units 20a, 20b, 20c, and 20d without deviation.

As in the case of the first embodiment, the control unit drives the light emitting panel 2a in any one of the normal light emission mode (first light emission mode) and the night-light mode (second light emission mode) in response to a control input from the outside (for example, operation by a user, control signals from external devices, etc.).

When the normal light emission mode (first light emission mode) is selected, the control unit drives the light emitting panel 2b so as to turn on each of the light emission units 20a, 20b, 20c, and 20d with relatively high luminance. In short, the control unit feeds a relatively large driving current to each of the light emission units 20a, 20b, 20c, and 20d. In the normal light emission mode, each of the light emission units 20a, 20b, 20c, and 20d may have luminance identical to or different from each other. The driving current fed to each of the organic EL elements which form the light emission units 20a, 20b, 20c, and 20d may be identical to or different from each other.

When the night-light mode (second light emission mode) is selected, the control unit drives the light emitting panel 2b so as to generate, as the whole light emitting panel, illumination light which is less bright than the light in the normal light emission mode.

FIG. 8 is a table showing variations in the light emission pattern (first to fourteenth light emission patterns) in the night-light mode in the light emitting panel 2b. In FIG. 8, $A_1$ represents a ratio ($B_{a2}/B_{a1}$ which is hereinafter referred to as a luminance ratio $A_1$) of luminance $B_{a2}$ in the night-light mode to luminance $B_{a1}$ in the normal light emission mode in the first light emission unit 20a. $A_2$ represents a ratio ($B_{b2}/B_{b1}$ which is hereinafter referred to as a luminance ratio $A_2$) of luminance $B_{b2}$ in the night-light mode to luminance $B_{b1}$ in the normal light emission mode in the second light emission unit 20b. $A_3$ represents a ratio ($B_{c2}/B_{c1}$ which is hereinafter referred to as a luminance ratio $A_3$) of luminance $B_{c2}$ in the night-light mode to luminance $B_{b1}$ in the normal light emission mode in the third light emission unit 20c. $A_4$ represents a ratio ($B_{d2}/B_{d1}$ which is hereinafter referred to as a luminance ratio $A_4$) of luminance $B_{d2}$ in the night-light mode to luminance $B_{d1}$ in the normal light emission mode in the fourth light emission unit 20d.

In the present embodiment, a life $LT_a$ of the first light emission unit 20a having the first luminescent color, a life $LT_b$ of the second light emission unit 20b having the second luminescent color, a life $LT_c$ of the third light emission unit 20c having the third luminescent color, and a life $LT_d$ of the fourth light emission unit 20d having the fourth luminescent color are assumed to have a relationship of $LT_a<LT_b<LT_c<LT_d$.

The first light emission pattern in the night-light mode is to turn off each of the first to third light emission units 20a, 20b, and 20c and to turn on each of the longest-life fourth light emission units 20d with the luminance equal to or lower than the luminance in the normal light emission mode ($0<A_4≤1$).

The second and third light emission patterns in the night-light mode are to turn off each of the relatively shorter-life first and second light emission units 20a and 20b and to turn on each of the relatively longer-life third and fourth light emission units 20c and 20d with the luminance equal to or lower than the luminance in the normal light emission mode. In the second light emission pattern, each of the third and fourth light emission units is driven so that the luminance ratio $A_3$ in the third light emission units 20c is equal to the luminance ratio $A_4$ of the fourth light emission units 20d ($0<A_3=A_4≤1$). In the third light emission pattern, each of the third and fourth light emission units is driven so that the luminance ratio $A_3$ in the third light emission units 20c is smaller than the luminance ratio $A_4$ of the fourth light emission units ($0<A_3<A_4≤1$).

The fourth to seventh light emission patterns in the night-light mode are to turn off each of the shortest-life first light emission units 20a and to turn on each of the second to fourth light emission units 20b, 20c, and 20d with the luminance equal to or lower than the luminance in the normal light emission mode. In the fourth light emission pattern, each of the second to fourth light emission units 20b, 20c, and 20d is driven so that the luminance ratio in each of the second to fourth light emission units is equal to each other ($0<A_2=A_3=A_4≤1$). In the fifth light emission pattern, each of the second to fourth light emission units is driven so that the luminance ratio $A_2$ of the second light emission units 20b is equal to the luminance ratio $A_3$ in the third light emission units 20c and the luminance ratio $A_3$ of the third light emission units 20c is smaller than the luminance ratio $A_4$ in the fourth light emission units 20d ($0<A_2=A_3<A_4≤1$). In the sixth light emission pattern, each of the second to fourth light emission units is driven so that the luminance ratio $A_2$ of the second light emission units 20a is smaller than the luminance ratio $A_3$ of the third light emission units 20c and the luminance ratio $A_3$ of the third light emission units 20c is equal to the luminance ratio $A_4$ in the fourth light emission units 20d ($0<A_2<A_3=A_4≤1$). In the seventh light emission pattern, each of the second to fourth light emission units is driven so that the luminance ratio $A_2$ of the second light emission units 20b is smaller than the luminance ratio $A_3$ in the third light emission units 20c and the luminance ratio $A_3$ of the third light emission units 20c is smaller than the luminance ratio $A_4$ of the fourth light emission units 20d ($0<A_2<A_3<A_4≤1$).

The eighth to fourteenth light emission patterns in the night-light mode are to turn on each of the first to fourth light emission units 20a, 20b, 20c, and 20d with the luminance equal to or lower than the luminance in the normal light emission mode. In the eighth to fourteenth modes, each of the light emission units is driven so that the luminance ratio $A_1$ of the shortest-life first light emission units 20a is smaller than the luminance ratio $A_4$ in the longest-life fourth light emission units 20d and is equal to or smaller than the luminance ratio $A_2$ of the second light emission units 20b. Further, each of the light emission units is driven so that the luminance ratio $A_2$ in the second light emission units 20b is equal to or smaller than the luminance ratio $A_3$ of the third light emission units 20c. Each of the light emission units is also driven so that the luminance ratio $A_3$ of the third light emission units 20c is equal to or smaller than the luminance ratio $A_4$ of the fourth light emission units 20d. In driving the light emitting panel 2b in the night-light mode, a light emission pattern may be made selectable from the first to fourteenth light emission patterns. The luminance of each of the light emission units 20a, 20b, 20c, and 20d is adjusted by the control unit controlling the driving current.

Thus, the lighting apparatus according to the third embodiment includes the light emitting panel 2b having four kinds of light emission units 20a, 20b, 20c, and 20d which are different in luminescent color from each other, and the light emitting panel 2b is driven in any one of the normal light emission mode (first light emission mode) and the night-light mode (second light emission mode) in accordance with the driving current from the control unit. In the night-light mode, as in the case of the aforementioned respective embodiments, the shorter-life light emission units are driven so as to have a less load than the longer-life light emission units. As a consequence, progression of luminance deterioration in the shorter-life light emission units in the night-light mode becomes slower than that of the longer-life light emission units. As a result, a difference in life between the respective light emission units (between the luminescent colors) can be decreased. Therefore, it becomes possible to reduce temporal change in chromaticity of the illumination light obtained by mixing the respective luminescent colors.

In the above-disclosed embodiments, the case of generating the illumination light with two to four luminescent colors has been illustrated. However, the number of luminescent colors may further be increased. In the above-disclosed embodiments, the case has been illustrated in which the luminance in the night-light mode is equal to or lower than the luminance in the normal light emission mode in all the light emission units ($A_1$, $A_2$, $A_3$, $A_4 \leq 1$). However, the light emitting panel may be driven so that the luminance in the night-light mode is larger than the luminance in the normal light emission mode in one or more light emission units ($A_n > 1$).

In each of the aforementioned embodiments, the night-light mode has been illustrated as the second light emission mode which is other than the normal light emission mode. However, the second light emission mode may be a light emission mode which is used as other than the night-light.

In each of the aforementioned embodiments, the case of forming the light emission units from organic EL elements have been illustrated. However, the light emission units may have light emitting layers formed from inorganic electroluminescence elements made of inorganic materials, such as zinc sulfide. In each of the aforementioned embodiments, the case has been described in which the light emission units different in luminescent color from each other are configured to be arranged side by side on the substrate. However, a plurality of light emitting layers which are different in luminescent color from each other may be configured to be laminated on the substrate.

REFERENCE SIGNS LIST

1 Lighting apparatus
2, 2a, 2b Light emitting panel
3 Control unit
10 Substrate
20a, 20b, 20c, 20d Light emission unit
21a, 21b, 22b, 22d Organic EL element

What is claimed is:

1. A lighting apparatus comprising;
   a plurality of light emission units for emitting lights in luminescent colors different from each other; and
   a control unit controlling in luminance the respective lights emitted from each of said plurality of light emission units, for the respective luminescent colors, wherein,
   in response to a control input, said control unit switches between a first light emission mode in which said light emission units emit light with luminances set for the respective luminescent colors and a second light emission mode in which light emission units corresponding to at least one luminescent color are turned off or emit light with a luminance lower than the luminance in the first light emission mode;
   for the lighting apparatus in the second light emission mode, each of the plurality of light emission units includes a luminance ratio defined as a ratio of a luminance of the second light emitting mode ($B_2$) to a luminance of the first light emitting mode ($B_1$), wherein the luminance ratio is different for different luminescent colors of light emission units, and a life of each of the light emission units is determined based on a color of the light emission unit;
   the control unit determines a light emission pattern for each of the plurality of light emission units, the light emission pattern comprising emitting one of the light emission units having a shorter life than other ones of the light emission units having a longer life, at a reduced luminance ratio that is less than the luminance ratios of the other ones of the light emission units; and
   in the second light emission mode, the control unit generates feeding driving currents to each of the plurality of light emission units to control the luminance of the luminance of the respective lights, based on the determined light emission pattern.

2. The lighting apparatus according to claim 1, wherein the light emission pattern comprises, for the second light emission mode, among the plurality of light emission units, turning off the light emission unit having a shorter life in the first light emission mode than other ones of the light emission units having a longer life in the first light emission mode.

3. The lighting apparatus according to claim 1, wherein, in the second light emission mode, all of the plurality of light emission units emit light with luminance lower than each luminance in the first light emission mode.

4. The lighting apparatus according to claim 1, wherein the control unit controls a driving current fed to each of the plurality of light emission units so as to control the luminance of the plurality of light emission units.

5. The lighting apparatus according to claim 1, wherein each of the plurality of light emission units are formed from respective organic electroluminescence elements.

6. The lighting apparatus of claim 1, wherein each of the plurality of light emitting units has a different color, and the luminance of each of the plurality of light emitting units in the night mode is managed such that the life of each of the plurality of light emitting units ends at the same time.

7. A light emission control method for a plurality of light emission units that respectively emit lights in luminescent colors different from each other in a lighting apparatus including said plurality of light emission units, the method comprising:
   switching between a first light emission mode in which are made said light emission units emit light with luminances set for the respective luminescent colors and a second light emission mode in which are made light emission units corresponding to at least one luminescent color turn off or emit light with luminance lower than the luminance hi the first light emission mode; wherein, for the lighting apparatus in the second light emission mode, each of the plurality of light emission units includes a luminance ratio defined as a ratio of a luminance of the second light emitting mode ($B_2$) to a luminance of the first light emitting mode ($B_1$), wherein the luminance ratio is different for different colors of light emission units, and a life of each of the light emission units is determined based on a color of the light emission unit; and determining a light emission pattern for each of the plurality of light emission units, the light emission pattern comprising emitting one of the light emission units having a shorter life than other ones of the light emission units having a longer life, at a reduced luminance ratio that is less than the luminance ratios of the other ones of the light emission units; and in the second light emission mode, generating feeding driving currents to each of the plurality of light emission units to control the luminance of the respective lights, based on the determined light emission pattern.

8. The light emission control method according to claim 7, wherein, the light emission pattern comprises, for the second light emission mode, among the plurality of light emission units, turning off the light emission unit having a shorter life in the first light emission mode than other ones of the light emission units having a longer life in the first light emission mode.

9. The light emission control method of claim 7, wherein each of the plurality of light emitting units has a different color, and the luminance of each of the plurality of light emitting units in the night mode is managed such that the life of each of the plurality of light emitting units ends at the same time.

* * * * *